(12) United States Patent
Ishizuka et al.

(10) Patent No.: US 11,871,191 B2
(45) Date of Patent: Jan. 9, 2024

(54) METHOD AND DEVICE FOR CONTROLLING FIR FILTER

(71) Applicant: Yamaha Corporation, Shizuoka (JP)

(72) Inventors: Kenji Ishizuka, Shizuoka (JP); Hiroomi Shidoji, Shizuoka (JP); Kenichi Tamiya, Shizuoka (JP)

(73) Assignee: YAMAHA CORPORATION, Shizuoka (JP)

( * ) Notice: Subject to any disclaimer, the term of this patent is extended or adjusted under 35 U.S.C. 154(b) by 183 days.

(21) Appl. No.: 17/515,356

(22) Filed: Oct. 29, 2021

(65) Prior Publication Data

US 2022/0141585 A1    May 5, 2022

(30) Foreign Application Priority Data

Oct. 30, 2020 (JP) ................................. 2020-182258

(51) Int. Cl.
*H04R 3/04* (2006.01)
*H03H 17/02* (2006.01)
*H03H 17/00* (2006.01)

(52) U.S. Cl.
CPC ............... *H04R 3/04* (2013.01); *H03H 17/02* (2013.01); *H03H 2017/0081* (2013.01)

(58) Field of Classification Search
None
See application file for complete search history.

(56) References Cited

U.S. PATENT DOCUMENTS

| 5,541,866 A | 7/1996 | Sato et al. |
| 2019/0123704 A1 * | 4/2019 | Watanabe .............. H03H 17/06 |

* cited by examiner

*Primary Examiner* — James K Mooney
(74) *Attorney, Agent, or Firm* — Global IP Counselors, LLP

(57) ABSTRACT

A method for controlling an FIR filter that processes sound signals based on setting of a band filter includes receiving, from a user, an instruction for control data that indicate a gain parameter of an amplitude characteristic corresponding to a transfer function represented as a function of angular frequency, generating a first amplitude characteristic that is an amplitude characteristic of the band filter, as a basis of an amplitude characteristic of the FIR filter, in accordance with the control data, receiving an instruction for a gain limit value from the user, limiting a gain curve of the first amplitude characteristic so as to be within the gain limit value that has been instructed, thereby acquiring a second amplitude characteristic, and setting filter coefficients of the FIR filter based on the second amplitude characteristic.

11 Claims, 5 Drawing Sheets

METHOD AND DEVICE FOR CONTROLLING FIR FILTER

CROSS-REFERENCE TO RELATED APPLICATIONS

This application claims priority to Japanese Patent Application No. 2020-182258, filed on Oct. 30, 2020. The entire disclosure of Japanese Patent Application No. 2020-182258 is hereby incorporated herein by reference.

BACKGROUND

Technical Field

The present invention relates to a method and device for controlling an FIR filter.

Background Information

Filters having a small configuration such as analog filters, IIR (Infinite Impulse Response) filters, etc., are used as filters for each band that make up a PEQ (Parametric Equalizer). The user can adjust the filter parameters in order to realize the desired amplitude characteristics for each of a plurality of bands. For example, U.S. Pat. No. 5,541,866 discloses a PEQ utilizing a Biquad filter.

SUMMARY

During the adjustment of an EQ, it can be desired to change a gain of a specific band without changing amplitude characteristics of a slope portion on either side of a given band. However, in a conventional EQ, if the gain of the band is increased or decreased, the amplitude characteristic of the slope portion adjacent to the band will be affected by this operation, so that there is the problem that the desired amplitude characteristics cannot be obtained.

In consideration of the circumstances described above, an object of this disclosure is to provide a technical means with which the gain of the specific band can be adjusted without changing the amplitude characteristic of the slope portion adjacent to the specific band in the filter.

This disclosure provides a method for controlling an FIR filter that processes sound signals based on band filter settings, comprising receiving, from a user, an instruction for control data that indicate a gain parameter of an amplitude characteristic corresponding to a transfer function represented as a function of angular frequency, generating a first amplitude characteristic that is an amplitude characteristic of the band filter, as a basis of an amplitude characteristic of the FIR filter, in accordance with the control data, receiving an instruction for a gain limit value from the user, limiting a gain curve of the first amplitude characteristic so as to be within the gain limit value that has been instructed, thereby acquiring a second amplitude characteristic, and setting filter coefficients of the FIR filter based on the second amplitude characteristic.

In addition, this disclosure provides a device for controlling an FIR filter that processes sound signals based on band filter settings, comprising an interface and one or more processors. The interface is configured to receive, from a user, an instruction for control data that indicate a gain parameter of an amplitude characteristic that corresponds to a transfer function represented as a function of angular frequency, and receive an instruction for a gain limit value from the user. The one or more processors are configured to generate a first amplitude characteristic that indicates an amplitude characteristic of the band filter, as a basis of an amplitude characteristic of the FIR filter, in accordance with the control data, limit a gain curve of the first amplitude characteristic so as to be within the gain limit value that has been instructed, thereby acquiring a second amplitude characteristic, and set filter coefficients of the FIR filter based on the second amplitude characteristic.

DETAILED DESCRIPTION OF THE EMBODIMENTS

Selected embodiments will now be explained with reference to the drawings. It will be apparent to those skilled in the field from this disclosure that the following descriptions of the embodiments are provided for illustration only and not for the purpose of limiting the invention as defined by the appended claims and their equivalents.

Figure 1:
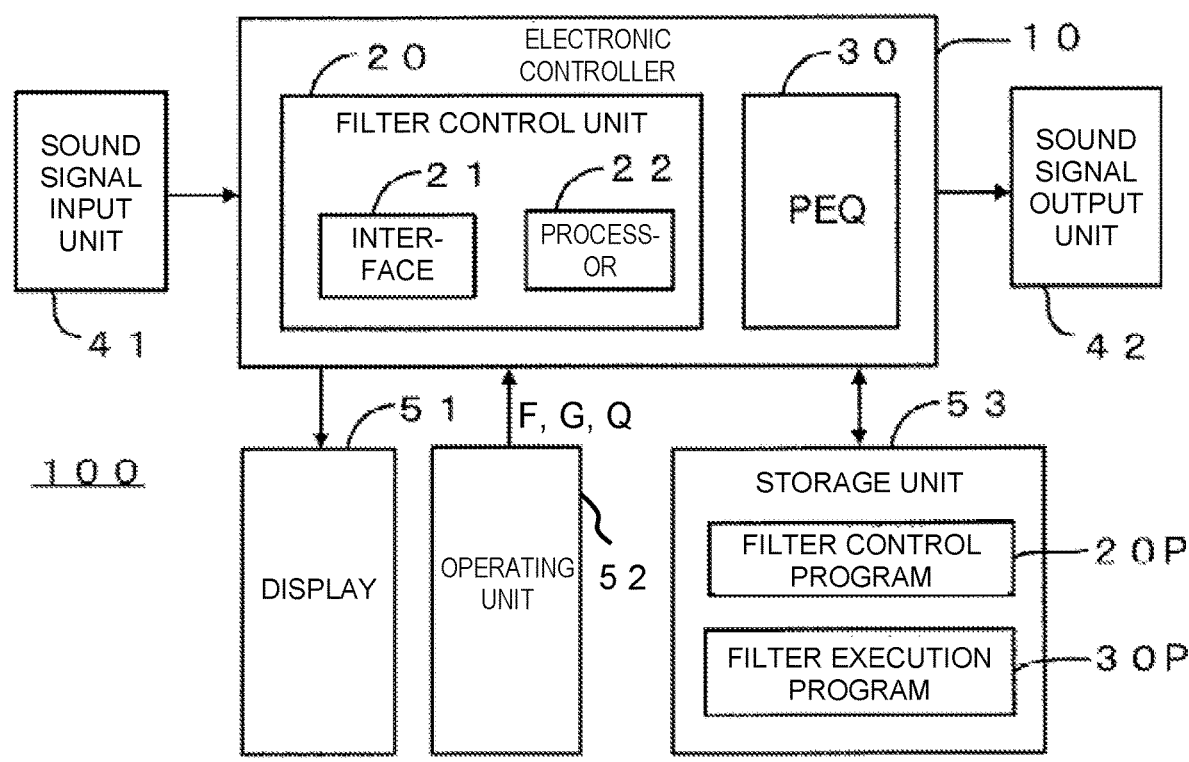
FIG. 1 is a block diagram showing a configuration of a signal processing device according to an embodiment of this disclosure.

FIG. 1 is a block diagram showing the configuration of a signal processing device 100 according to an embodiment of this disclosure. As shown in FIG. 1, the signal processing device 100 comprises an electronic controller 10, a sound signal input unit 41, a sound signal output unit 42, a display 51, an operating unit 52, and a storage unit 53. The signal processing device 100 is installed in various devices such as mixers, AV amplifiers, car audio devices, conference systems, powered speakers, etc., and functions as a PEQ (Parametric Equalizer) with adjustable amplitude characteristics.

The electronic controller 10 acts as a control center for the overall control of the signal processing device 100. The term "electronic controller" as used herein refers to hardware that executes software programs. The electronic controller 10 includes at least an interface, and one processor such as a CPU (Central Processing Unit). The electronic controller 10 can be configured to comprise, instead of the CPU or in addition to the CPU, programmable logic devices such as a DSP (Digital Signal Processor), an FPGA (Field Programmable Gate Array), and the like. In addition, the electronic controller 10 can include a plurality of CPUs (or a plurality of programmable logic devices). The display (display unit) 51 is a device that provides various display information to the user, and includes a liquid-crystal display panel, or the like. The operating unit (user operable input) 52 is operated by the user for providing various data and instructions to the electronic controller 10, and includes various operators such as a keyboard or a pointing device. The display 51 and the operating unit 52 can be a touch panel that combines the respective functions of both units.

The sound signal input unit 41 is a device that retrieves sound signals from an external device (not shown) such as a tuner, an audio playback device, or the like, and supplies the sound signals to the electronic controller 10. The sound signal output unit 42 is a device that supplies sound signals output from the electronic controller 10 to an external device, not shown, such as a speaker and causes the external device to emit sound.

The storage unit (computer memory) 53 is any computer storage device or any non-transitory computer-readable medium with the sole exception of a transitory, propagating signal. For example, the storage unit 53 can include non-volatile memory and volatile memory, and can includes a ROM (Read Only Memory) device, a RAM (Random Access Memory) device, a hard disk, a flash drive, etc. The storage unit 53 is configured to store settings, programs, data, calculations and/or results of the processor(s) of the electronic controller 10. In this embodiment, the storage unit 53 is formed of a volatile storage unit such as a RAM and a non-volatile storage unit such as a ROM or an HD (Hard Disk). The volatile storage unit is used by the electronic controller 10 as a work area. The non-volatile storage unit contains various programs and fixed control data. Programs stored in the non-volatile storage unit include a filter control program 20P, which causes the electronic controller 10 to function as a filter control unit 20, and a filter execution program 30P, which causes the electronic controller 10 to function as a PEQ 30.

In the present embodiment, the filter execution program 30P causes the electronic controller 10 to function as an FIR (Finite Impulse Response) filter, and thus as the PEQ 30. The electronic controller 10, functioning as the PEQ 30, retrieves samples of the sound signal to be processed from the sound signal input unit 41, and applies a process to boost or cut each band of a plurality of bands (peaking filter process, referred to herein as band filtering), and the processed samples are then output by the sound signal output unit 42. Here, one band filtering process increases or decreases the gain of the band of the sound signal to be processed. The electronic controller 10 executes a boost/cut process for a plurality of band filters by one FIR filter. That is, in the FIR filter process, the electronic controller 10 convolves a prescribed number of filter coefficients stored in the volatile storage unit of the storage unit 53 for a prescribed number of previously retrieved samples, and outputs a sample of the sound signal to which a frequency response that corresponds to the filter coefficients has been given. In general, the frequency response of an FIR filter is defined by the amplitude and phase characteristics.

In addition, in the present embodiment, the filter control unit 20P causes the electronic controller 10 to function as the filter control unit 20 that generates one set of FIR filter coefficients to be used by the band filtering process (that is, a peaking type filter) executed by the PEQ 30 for a plurality of bands, and stores the filter coefficients in the volatile storage unit of the storage unit 53. The filter control unit 20 has an interface (input unit) 21 and a processor (processing unit) 22.

The electronic controller 10 executes a plurality of units including the filter control unit 20 and the PEQ 30. In the present embodiment, the filter control unit 20 processes an instruction from the user with respect to the amplitude characteristic (amplitude frequency response) of each of a plurality of band filters, and, based on the instructed amplitude frequency responses, generates the filter coefficients for a plurality of band filtering processes (that is, of one FIR filter serving as a plurality of peaking type filters). Then, in the present embodiment, in order to facilitate the user's instruction to the filter control unit 20 of the completed profile of the desired amplitude characteristic, a transfer function is used which becomes a template for generating the amplitude characteristics that are the basis of the completed profile. More specifically, via the operating unit 52, the interface 21 of the filter control unit 20 receives from the user an instruction for a control data to control a gain and an instruction for a gain limit value for each of a plurality of the band filters to be subjected to the band boost/cut process. In addition, the processor 22 generates a first amplitude characteristic as a basis of the amplitude characteristic of the FIR filter, based on a transfer function (template) expressed as a function of angular frequency and the control data received from the user. In the present embodiment, the transfer function of a Biquad type filter, which is familiar to many users as a peaking type filter, is used as the transfer function of the band filter template. Then, the processor 22 limits (trims) the gain of the first amplitude characteristic of the band filter so as to be within the instructed limit value, thereby acquiring a second amplitude characteristic. Then, the processor 22 sets the filter coefficients for one FIR filter based on a plurality of second amplitude characteristics. In the present embodiment, the processor 22 is formed of one processor. However, the processor 22 can be formed of a plurality of processors.

Figure 2:
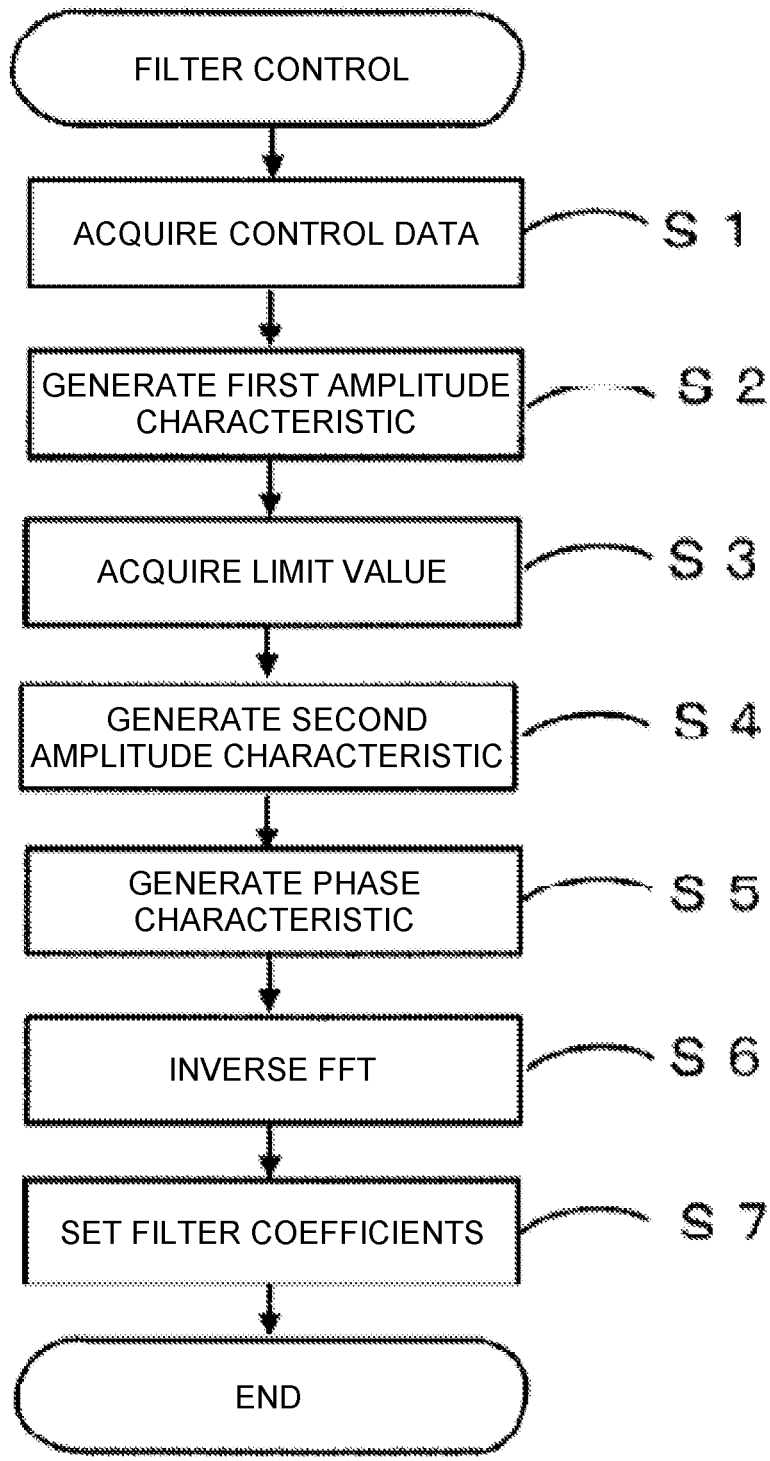
FIG. 2 is a flowchart showing an operation of the embodiment.

The operation of the present embodiment will now be described. When the filter coefficients are set by issuing instructions to each of the plurality of band filters constituting the PEQ 30 by operating the operating unit 52, the electronic controller 10 executes the filter control program 20P stored in the non-volatile storage unit of the storage unit 53. FIG. 2 is a flowchart showing the operation of setting the filter coefficients for one FIR filter in accordance with the adjustment of each band filter in the PEQ 30, from among the operations of the electronic controller 10 in this case.

First, the electronic controller 10, acting as the interface 21, acquires control data from the user (Step S1). More specifically, the electronic controller 10 receives from the user, an instruction for the control data that indicate at least a gain parameter G of the amplitude characteristic corresponding to the transfer function represented as the function of angular frequency. The control data include information that indicates, with respect to the amplitude characteristic of a band filter of the PEQ 30 (in the present embodiment, the amplitude characteristic of a Biquad type filter), the center frequency F of the band whose gain (gain curve) is to be controlled the gain parameter G at the center frequency F, and the sharpness Q of the gain curve of the band.

Next, the electronic controller 10, acting as the processor 22, generates a first amplitude characteristic that indicates an amplitude characteristic of the band filter, as a basis of the amplitude characteristic of the FIR filter, in accordance with the control data. More specifically, the electronic controller 10 generates, based on the transfer function of the Biquad type filter, the first amplitude characteristic of the band filter corresponding to the sharpness Q, the gain parameter G, and the center frequency F indicated by the control data (Step S2).

Figure 3:
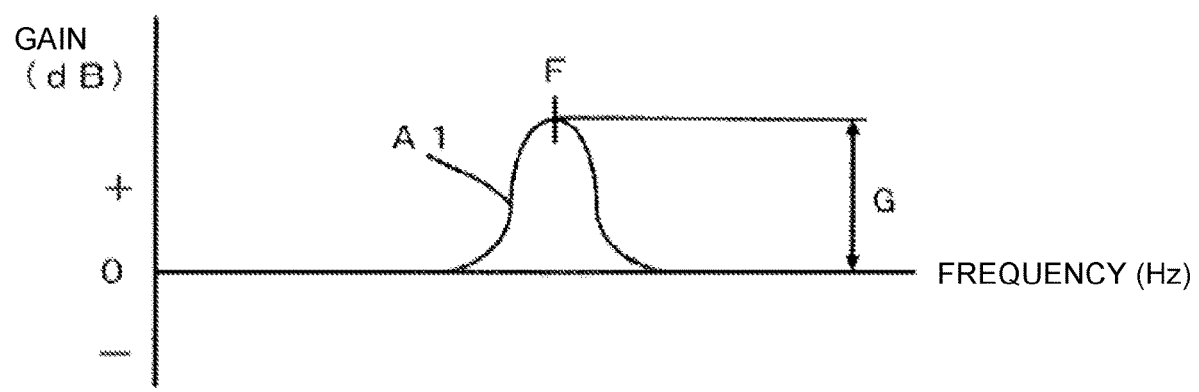
FIG. 3 is a diagram illustrating a display screen of a display of the embodiment.

In this Step S2, the processor 22 displays on the display 51 the first amplitude characteristic generated by receiving the control data. FIG. 3 illustrates a first amplitude characteristic A1 displayed on the display 51. As shown in FIG. 3, in Step S2, the first amplitude characteristic A1 is generated in which the gain is boosted (increased) from 0 dB by G at the center frequency F. In a preferred embodiment, the processes of steps S1 and S2 are repeated until the first amplitude characteristic A1 displayed on the display 51 has the characteristic desired by the user.

Then, when the first amplitude characteristic A1 has the characteristic desired by the user, the electronic controller 10 receives an instruction for a gain limit value from the user. More specifically, the electronic controller 10, via the interface 21, acquires an instruction for a gain limit value G_top of the band filter via the operating unit 52 (Step S3).

Figure 4:
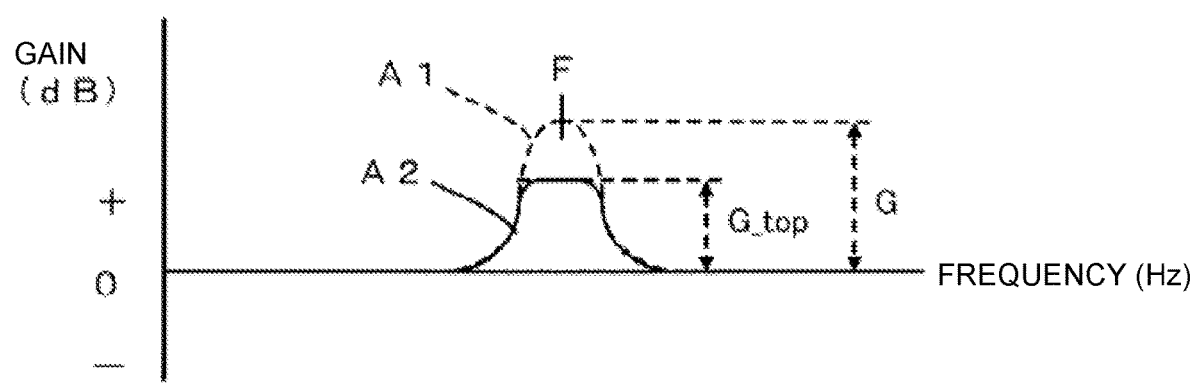
FIG. 4 is a diagram illustrating a display screen of the display of the embodiment.
Figure 5:
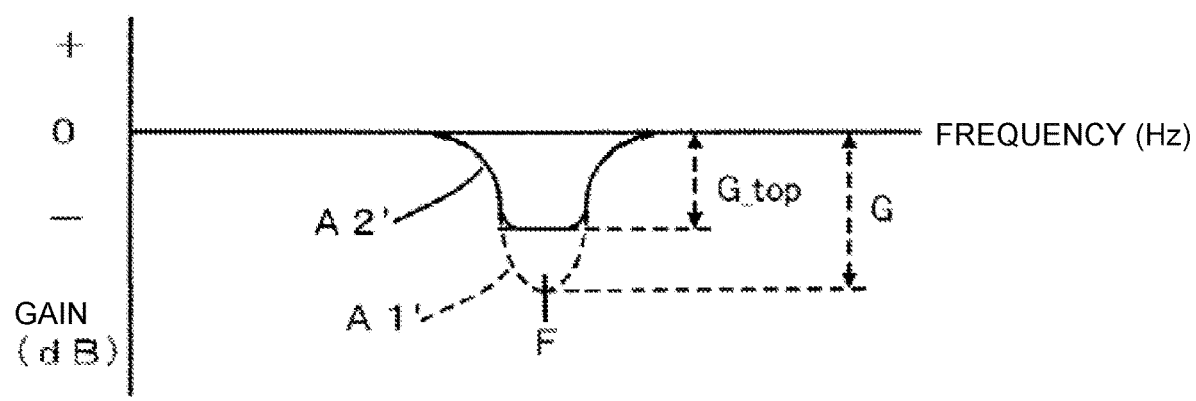
FIG. 5 is a diagram illustrating a display screen of the display of the embodiment.

The electronic controller 10, acting as the processor 22, then trims (limits) the gain (gain curve) of the first amplitude characteristic A1 so as to be within the instructed gain limit value G_top, and thereby acquires a second amplitude characteristic of the band filter (Step S4). Specifically, the electronic controller 10 limits the gain curve of the first amplitude characteristic A1 shown as the curved line in FIG. 3 and the curved dotted line in FIG. 4 so as to be less than or equal to the gain limit value G_top for the band for which the gain curve exceeds the gain limit value G_top in the entire first amplitude characteristic A1, thereby acquiring the second amplitude characteristic. In a preferred embodiment, in this Step S4, the processor 22 acquires the second amplitude characteristic by rounding the corners of the amplitude characteristic (generated amplitude characteristic) generated by limiting the gain curve of the first amplitude characteristic A1 so as to be within the gain limit value G_top. The processor 22 then displays on the display 51 the second amplitude characteristic generated by receiving the gain limit value G_top. FIG. 4 illustrates a second amplitude characteristic A2 displayed on the display 51. In a preferred embodiment, the processes of steps S1 to S4 are repeated until the second amplitude characteristic A2 displayed on the display 51 has the characteristic desired by the user. Instead of boosting the sound signal of the band by increasing the gain of the center frequency of the band filter (FIGS. 3 and 4), the sound signal of the band can be cut by decreasing the gain (FIG. 5).

When the second amplitude characteristic A2 has the characteristic desired by the user, the electronic controller 10, acting as the processor 22, then executes each process for setting the filter coefficients of one FIR filter based on the second amplitude characteristics A2 of all of the band filters of the PEQ, that include the band filter.

The processor 22 first combines the second amplitude characteristics A2 of a plurality of band filters to generate one combined second amplitude characteristic A2. The processor 22 then generates the corresponding phase characteristic (phase frequency response) from the combined second amplitude characteristic A2 (Step S5). In the present embodiment, in Step S5, the minimum phase characteristic that is compatible with the amplitude characteristics of an analog filter or an IIR (Infinite Impulse Response) filter is generated.

Next, the processor 22 applies an inverse FFT (Fast Fourier Transform) to the second amplitude characteristic A2 and the phase characteristic generated in Step S5, and generates the impulse response of the FIR filter (Step S6).

The processor 22 then sets the filter coefficients of the FIR filter based on the second amplitude characteristic A2. More specifically, the processor 22 samples the impulse response generated in Step Sb, thereby generating the filter coefficients of one FIR filter corresponding to the plurality of band filters that make up the PEQ 30, and stores the filter coefficients in the volatile storage unit of the storage unit 53 (Step S7).

The PEQ 30 uses the filter coefficients set in this manner to carry out a boost or a cut process for each of the plurality of bands described above.

As described above, by the present embodiment, it is possible to adjust the gain (gain curve) at the center of a band without changing the slope (amplitude characteristic) of the tails of the band for which the gain (gain curve) is controlled.

In addition, in the present embodiment, the transfer function of a Biquad type filter, which is used by many users as a Peaking type filter, is used to generate the first amplitude characteristic. For this reason, the user first adjusts the amplitude characteristic of the band filter in a way familiar to the user, and then adjusts the gain at the center frequency of the band. In the second amplitude characteristic of each band filter, the amplitude characteristic of the band other than the band for which the gain is trimmed is the amplitude characteristic of the Biquad type filter.

One embodiment of this disclosure was described above, but other embodiments of this disclosure are possible. For example, in the above-described embodiment, this disclosure is applied to a band filter of a PEQ, but this disclosure is not limited thereto. This disclosure can be applied to a graphic equalizer in which the center frequency of each band filter is fixed or a multi-band vocoder used for converting audio signals.

The Biquad type filter in the above-described embodiment is one example of an analog filter or an IIR filter. In general, the transfer function of the amplitude characteristic of an analog filter or an IIR filter other than a Biquad type filter used for band buck/boost process as a Peaking filter is expressed as a function of angular frequency, so that it can be used as a template for the amplitude characteristic of a band filter.

What is claimed is:

1. A method for controlling an FIR filter that processes sound signals based on setting of a band filter, the method comprising:
   receiving, from a user, an instruction for control data that indicate a gain parameter of an amplitude characteristic corresponding to a transfer function represented as a function of angular frequency;
   generating a first amplitude characteristic that indicates an amplitude characteristic of the band filter, as a basis of an amplitude characteristic of the FIR filter, in accordance with the control data;
   receiving an instruction for a gain limit value from the user;
   limiting a gain curve of the first amplitude characteristic so as to be within the gain limit value that has been instructed, thereby acquiring a second amplitude characteristic; and
   setting filter coefficients of the FIR filter based on the second amplitude characteristic,
   the limiting of the gain curve being performed by limiting the gain curve of the first amplitude characteristic so as to be less than or equal to the gain limit value for a band for which the gain curve of the first amplitude characteristic exceeds the gain limit value in an entirety of the first amplitude characteristic, thereby acquiring the second amplitude characteristic, and
   the acquiring of the second amplitude characteristic being performed by rounding corners of a generated amplitude characteristic generated by limiting the gain curve of the first amplitude characteristic so as to be within the gain limit value.

2. The method according to claim 1, wherein
   the control data further specify a center frequency of the band for which the gain curve of the first amplitude characteristic is controlled.

3. The method according to claim 1, wherein
   the control data further specify a sharpness of the band for which the gain curve of the first amplitude characteristic is controlled.

4. The method according to claim 1, wherein
the first amplitude characteristic indicates an amplitude characteristic of an analog filter or an IIR filter.

5. The method according to claim 1, wherein
the first amplitude characteristic indicates an amplitude characteristic of a Biquad type filter.

6. A device for controlling an FIR filter that processes sound signals based on setting of band filter, the device comprising:
an interface configured to receive, from a user, an instruction for control data that indicate a gain parameter of an amplitude characteristic that corresponds to a transfer function represented as a function of angular frequency, and receive an instruction for a gain limit value from the user; and
one or more processors configured to
generate a first amplitude characteristic that indicates an amplitude characteristic of the band filter, as a basis of an amplitude characteristic of the FIR filter, in accordance with the control data,
limit a gain curve of the first amplitude characteristic so as to be within the gain limit value that has been instructed, thereby acquiring a second amplitude characteristic, and
set filter coefficients of the FIR filter based on the second amplitude characteristic,
the one or more processors being configured to limit the gain curve of the first amplitude characteristic so as to be less than or equal to the gain limit value for a band for which the gain curve of the first amplitude characteristic exceeds the gain limit value in an entirety of the first amplitude characteristic, thereby acquiring the second amplitude characteristic, and
the one or more processors being configured to round corners of a generated amplitude characteristic generated by limiting the gain curve of the first amplitude characteristic so as to be within the gain limit value.

7. The device according to claim 6, further comprising a display, wherein
the interface is configured to display the first amplitude characteristic on the display in response to receiving the control data, and display the second amplitude characteristic on the display in response to receiving the gain limit value.

8. The device according to claim 6, wherein
the control data further specify a center frequency of the band for which the gain curve of the first amplitude characteristic is controlled.

9. The device according to claim 6, wherein
the control data further specify a sharpness of the band for which the gain curve of the first amplitude characteristic is controlled.

10. The device according to claim 6, wherein
the first amplitude characteristic indicates an amplitude characteristic of an analog filter or an IIR filter.

11. The device according to claim 6, wherein
the first amplitude characteristic indicates an amplitude characteristic of a Biquad type filter.

* * * * *